US009368525B2

(12) United States Patent
Morosawa

(10) Patent No.: US 9,368,525 B2
(45) Date of Patent: Jun. 14, 2016

(54) DISPLAY DEVICE AND ELECTRONIC APPARATUS

(75) Inventor: Narihiro Morosawa, Kanagawa (JP)

(73) Assignee: JOLED Inc., Tokyo (JP)

(*) Notice: Subject to any disclaimer, the term of this patent is extended or adjusted under 35 U.S.C. 154(b) by 5 days.

(21) Appl. No.: 13/415,625

(22) Filed: Mar. 8, 2012

(65) Prior Publication Data

US 2012/0249915 A1 Oct. 4, 2012

(30) Foreign Application Priority Data

Mar. 29, 2011 (JP) ................................. 2011-071487

(51) Int. Cl.
G02F 1/1362 (2006.01)
H01L 27/12 (2006.01)
H01L 27/32 (2006.01)

(52) U.S. Cl.
CPC ...... *H01L 27/1255* (2013.01); *G02F 1/136213* (2013.01); *H01L 27/1225* (2013.01); *H01L 27/3265* (2013.01)

(58) Field of Classification Search
CPC ............................................... G02F 1/136213
USPC .......................................................... 349/43
See application file for complete search history.

(56) References Cited

U.S. PATENT DOCUMENTS

| 8,411,215 B2 * | 4/2013 | Nakagawa | 349/39 |
|---|---|---|---|
| 2004/0155242 A1 * | 8/2004 | Segawa et al. | 257/59 |
| 2009/0009674 A1 * | 1/2009 | Chung et al. | 349/39 |
| 2009/0225247 A1 * | 9/2009 | Yagi et al. | 349/39 |
| 2010/0039574 A1 * | 2/2010 | Hirakata et al. | 349/38 |
| 2010/0066646 A1 * | 3/2010 | Ota | 345/9 |

FOREIGN PATENT DOCUMENTS

| JP | 2000-312005 | 11/2000 |
|---|---|---|
| JP | 2006-106076 | 4/2006 |
| JP | 2007-101843 | 4/2007 |
| JP | 2007-220817 | 8/2007 |
| JP | 2010-156963 | 7/2010 |

OTHER PUBLICATIONS

R. Hayashi et al. "Improved Amorphous In—Ga—Zn—O TFTs", SID 08 Digest, 2008, 42.1, pp. 621-624.*
Hayashi et al., "Improved Amorphous In—Ga—Zn—O TFTs," SID Symposium Digest of Technical Papers, May 2008, vol. 39, Issue 1, pp. 621-624. (4 pages).
Park et al., "Self-aligned top-gate amorphous gallium indium zinc oxide thin film transistors," Applied Physics Letters, Aug. 2008, vol. 93, Issue 5, pp. 053501-053501-3. (3 pages).
Official Action (no English translation available) for Japanese Patent Application No. 2011-071487 mailed Oct. 21, 2014, 5 pages.

* cited by examiner

*Primary Examiner* — Michael Caley
*Assistant Examiner* — Edmond Lau
(74) *Attorney, Agent, or Firm* — Sheridan Ross P.C.

(57) ABSTRACT

A display device includes a substrate, a display element, a transistor as a drive element of the display element, and a holding capacitance element holding electric charge corresponding to a video signal. The display element, the transistor, and the holding capacitance element are provided on the substrate. The holding capacitance element includes a first semiconductor layer including an oxide semiconductor, a first conductive film provided on the first semiconductor layer, a first insulating film provided between the first semiconductor layer and the first conductive film, and a recess formed by removing part or all in thickness of the first conductive film and the first insulating film in a selective region on the first semiconductor layer.

16 Claims, 17 Drawing Sheets

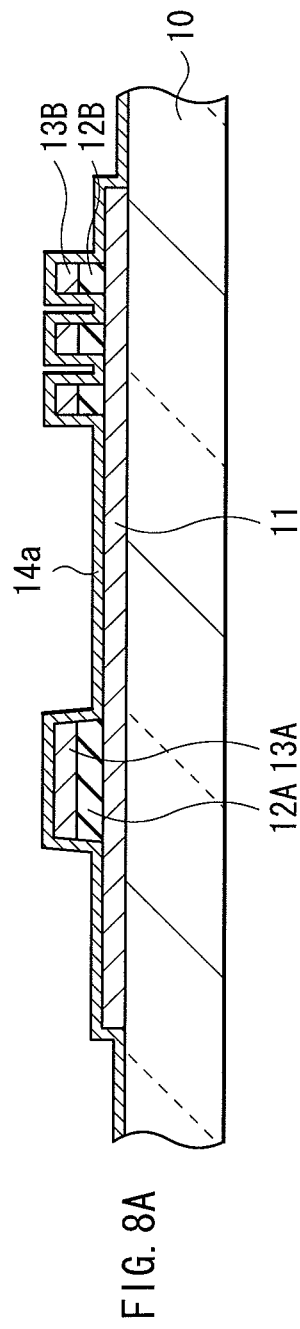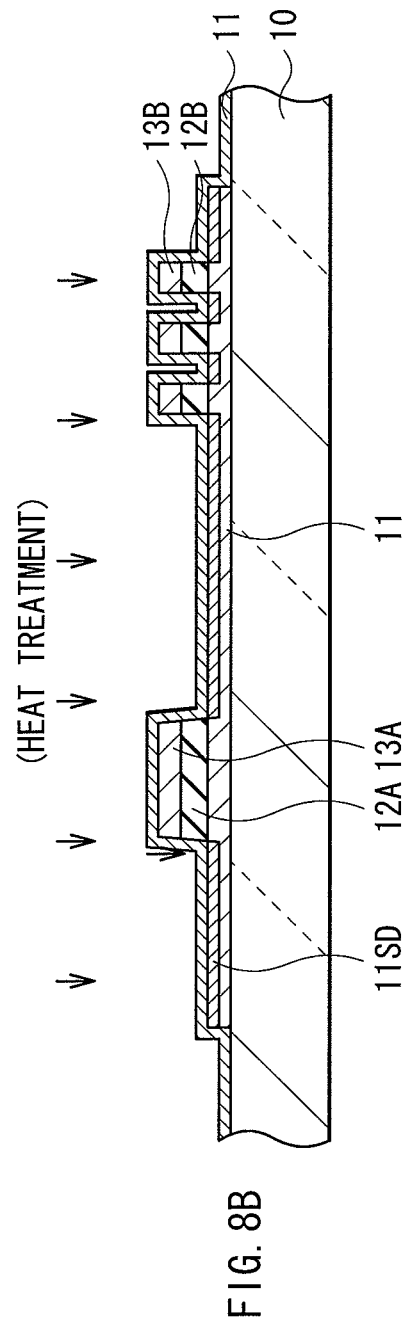

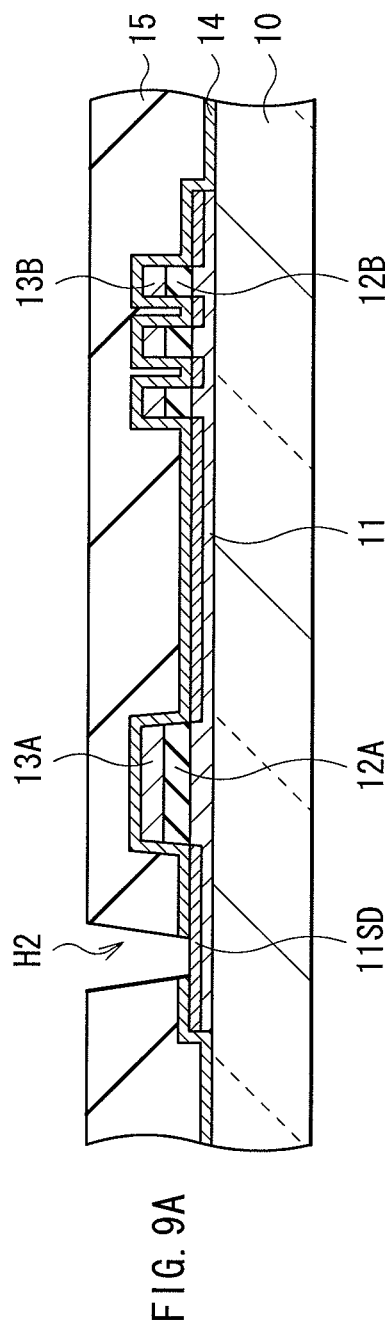
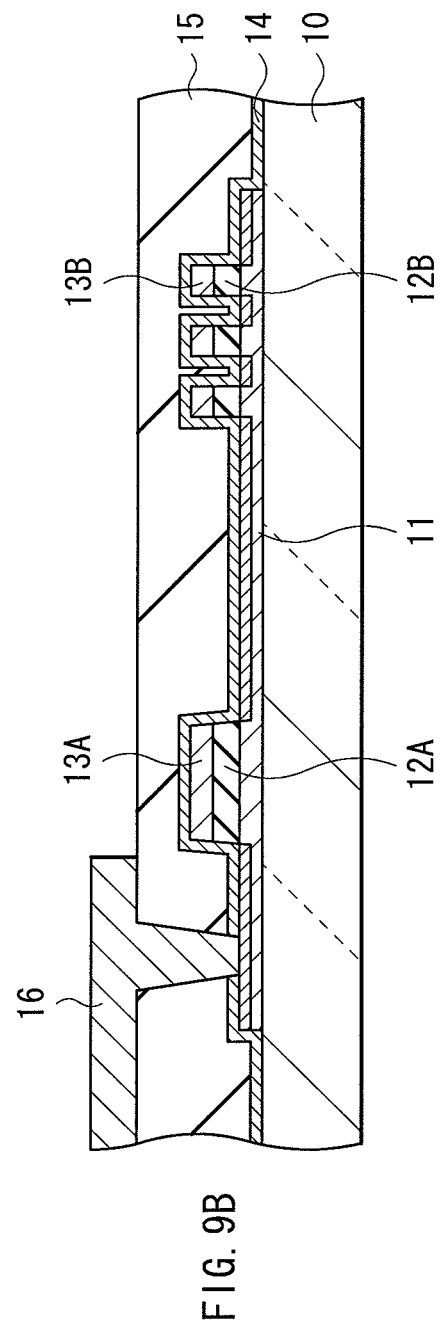

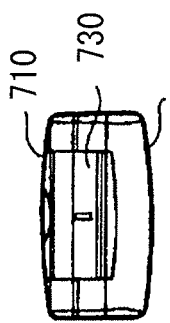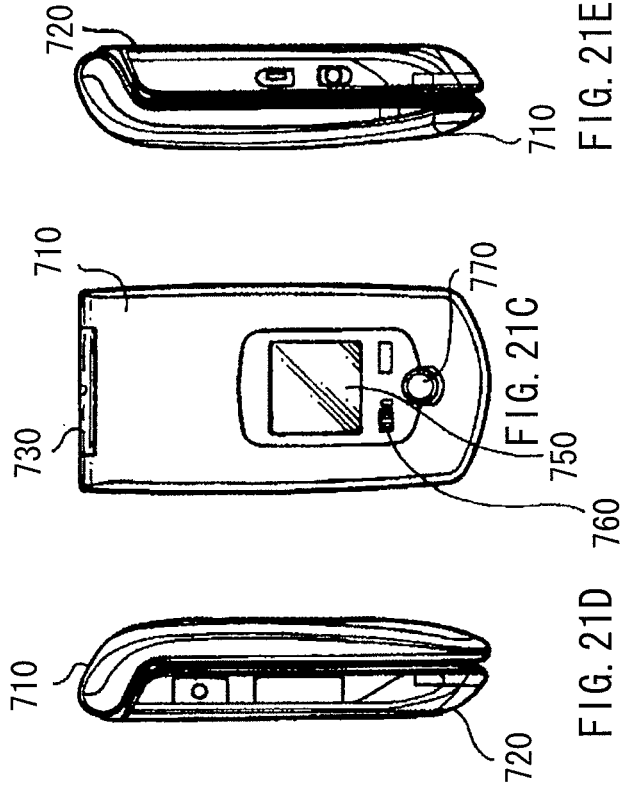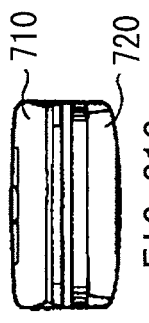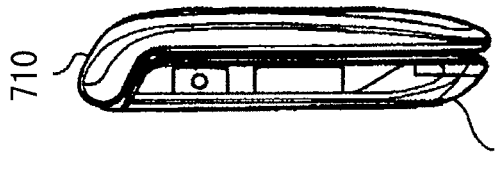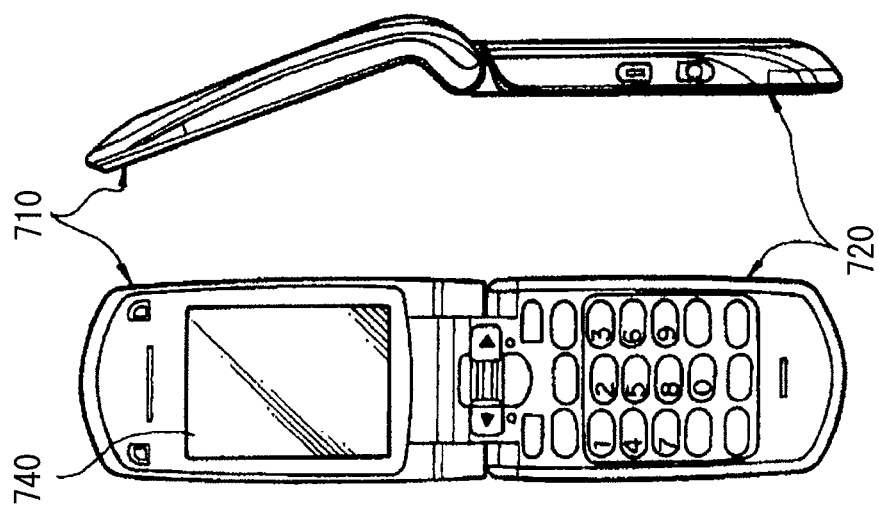

DISPLAY DEVICE AND ELECTRONIC APPARATUS

CROSS REFERENCES TO RELATED APPLICATIONS

The present application claims priority to Japanese Priority Patent Application JP 2011-071487 filed in the Japan Patent Office on Mar. 29, 2011, the entire content of which is hereby incorporated by reference.

BACKGROUND

The present disclosure relates to a display device preferable for an organic electroluminescence (EL) display device and a liquid crystal display device, and to an electronic apparatus including the display device.

In an active-drive liquid crystal display device or organic EL display device, a thin film transistor is used as a driving element, and a holding capacitance element holds electric charge corresponding to a signal voltage for writing a video image. If parasitic capacitance increases in a crossing region of a gate electrode of the thin film transistor and a source or drain electrode thereof, a variation in the signal voltage may occur, leading to degradation in image quality.

In particular, the organic EL display device needs to have a large holding capacitance for a large parasitic capacitance, leading to an increase in occupancy of wirings in a pixel layout. This results in an increase in probability of an interwiring short and the like, leading to a reduction in production yield.

In the past, attempts have been made to reduce the parasitic capacitance, which is formed in a crossing region of a gate electrode and a source or drain electrode, for thin film transistors including oxide semiconductor such as zinc oxide (ZnO) or indium-gallium-zinc oxide (IGZO) as channels.

For example, Japanese Unexamined Patent Application Publication No. 2007-220817 and J. Park et al., "Self-Aligned Top-Gate Amorphous Gallium Indium Zinc Oxide Thin Film Transistors", Applied Physics Letters, American Institute of Physics, 2008, 93, 053501 describe a self-aligned top-gate thin film transistor, in which a gate electrode and a gate insulating film are formed in the same shape on a channel region of an oxide semiconductor thin-film layer, and then resistance of a region, which is not covered with the gate electrode and the gate insulating film, of the oxide semiconductor thin-film layer is decreased so that the region is formed into a source/drain region. R. Hayashi et al. "Improved Amorphous In—Ga—Zn—O TFTs", SID 08 DIGEST, 2008, 42.1, pp. 621-624 describes a self-aligned bottom-gate thin film transistor, in which a source and drain regions are formed in an oxide semiconductor film through back exposure with a gate electrode as a mask.

SUMMARY

The holding capacitance element, which is provided on a substrate together with the transistor including oxide semiconductor as described above, is desired to maintain a desired capacitance to suppress the degradation in image quality.

It is desirable to provide a display device capable of suppressing the degradation in image quality, and an electronic apparatus including the display device.

A display device according to an embodiment of the disclosure includes a substrate, and includes, a display element, a transistor as a drive element of the display element, and a holding capacitance element holding electric charge corresponding to a video signal. The display element, the transistor, and the holding capacitance element are provided on the substrate. The holding capacitance element includes a first semiconductor layer including an oxide semiconductor, a first conductive film provided on the first semiconductor layer, a first insulating film provided between the first semiconductor layer and the first conductive film, and a recess formed by removing part or all in thickness of the first conductive film and the first insulating film in a selective region on the first semiconductor layer.

An electronic apparatus according to the embodiment of the disclosure includes a display device including a substrate, and including, on the substrate, a display element, a transistor as a drive element of the display element, and a holding capacitance element holding electric charge corresponding to a video signal. The holding capacitance element includes a first semiconductor layer including an oxide semiconductor, a first conductive film provided on the first semiconductor layer, a first insulating film provided between the first semiconductor layer and the first conductive film, and a recess formed by removing part or all in thickness of the first conductive film and the first insulating film in a selective region on the first semiconductor layer.

In the display device and the electronic apparatus according to the embodiment of the disclosure, the holding capacitance element, which is provided together with the display element and the transistor on the substrate, has the first conductive film on the first semiconductor layer including the oxide semiconductor with the first insulating film therebetween, and has the recess formed by removing part or all in thickness of the first conductive film and the first insulating film in the selective region on the first semiconductor layer. Oxygen easily separates from the oxide semiconductor of the first semiconductor layer through the recess. This suppresses a variation in capacitance of the holding capacitance element depending on an applied voltage.

According to the display device and the electronic apparatus of the embodiment of the disclosure, the holding capacitance element, which is provided together with the display element and the transistor on the substrate, has the first conductive film on the first semiconductor layer including the oxide semiconductor with the first insulating film therebetween, and has the recess formed by removing part or all in thickness of the first conductive film and the first insulating film in the selective region on the first semiconductor layer. This suppresses a variation in capacitance of the holding capacitance element depending on an applied voltage, so that the holding capacitance element may maintain a desired capacitance. As a result, a reduction in image quality may be suppressed.

It is to be understood that both the foregoing general description and the following detailed description are exemplary, and are intended to provide further explanation of the technology as claimed.

Additional features and advantages are described herein, and will be apparent from the following Detailed Description and the figures.

BRIEF DESCRIPTION OF THE FIGURES

The accompanying drawings are included to provide a further understanding of the disclosure, and are incorporated in and constitute a part of this specification. The drawings illustrate embodiments and, together with the specification, serve to explain the principles of the technology.

FIGS. 8A and 8B illustrate steps following the steps in FIG. 7B.

FIGS. 9A and 9B illustrate steps following the steps in FIG. 8B.

FIG. 21A is a front view of an application example 5 in an opened state, FIG. 21B is a side view thereof, FIG. 21C is a front view thereof in a closed state, FIG. 21D is a left side view thereof, FIG. 21E is a right side view thereof, FIG. 21F is a top view thereof, and FIG. 21G is a bottom view thereof.

DETAILED DESCRIPTION

An embodiment of the disclosure is described below with reference to the accompanying drawings. Description is made in the following order.
1. Embodiment (example of an organic EL display device having holding capacitance elements with oxide semiconductor).
2. Modification (example of a liquid crystal display device having holding capacitance elements with oxide semiconductor).
3. Application examples (examples of a module and electronic apparatuses)

[Embodiment]
[Configuration]

Figure 1:
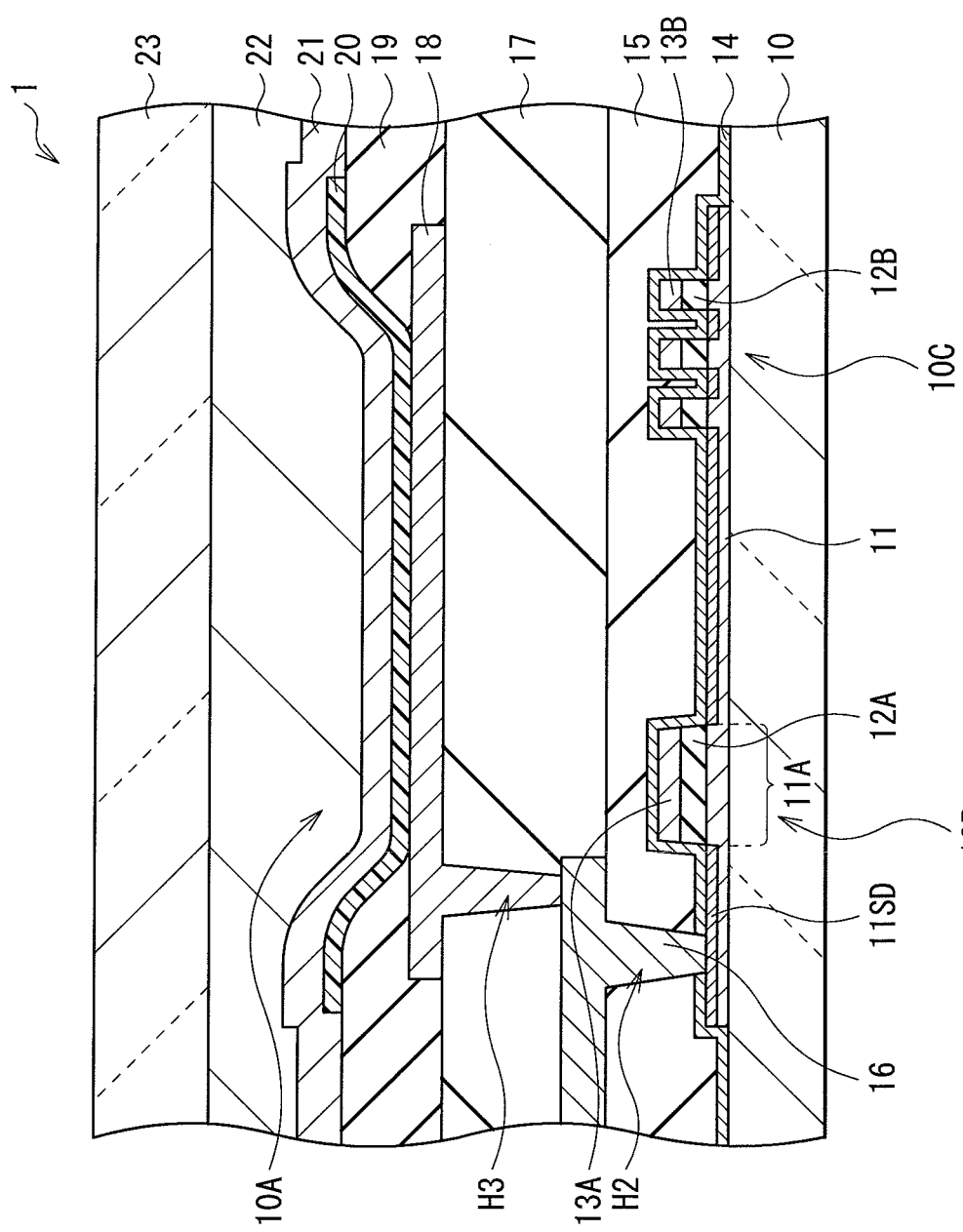
FIG. 1 illustrates a sectional structure of an organic EL display device according to an embodiment of the disclosure.

FIG. 1 illustrates a sectional structure of a display device (organic EL display device 1) according to an embodiment of the disclosure. The organic EL display device 1 includes a plurality of pixels (organic EL elements 10A) that are driven in an active-matrix drive method, for example. It is to be noted that FIG. 1 shows only a region corresponding to one pixel (sub-pixel). In the organic EL display device 1, for example, a transistor 10B and a holding capacitance element 10C are provided on a substrate 10, and the organic EL element 10A is provided on the components. The organic EL element 10A is sealed by, for example, a protective layer 22, and a sealing substrate 23 is attached on the protective layer 22 with a not-shown adhesive layer therebetween. An emission type of the organic EL display device 1 may be a so-called top emission type or a bottom emission type. A configuration of each of the organic EL element 10A, the transistor 10B, and the holding capacitance element 10C is specifically described below.

[Organic EL Element 10A]

The organic EL element 10A has a pixel separation film 19 having an opening for each pixel on a first electrode 18, and has an organic layer 20 in the opening of the pixel separation film 19. A second electrode 21 is provided on the organic layer 20.

The first electrode 18, which functions as an anode, for example, is provided for each pixel. In the bottom emission type, the first electrode 18 is configured of a transparent conductive film, for example, a single-layer film including one of indium-tin oxide (ITO), indium-zinc oxide (IZO), and indium/zinc oxide (InZnO) or a stacked film including two or more of them. In the top emission type, the first electrode 18 is configured of a single-layer film including a simple metal including one or more of aluminum (Al), magnesium (Mg), calcium (Ca), and sodium (Na), or a single-layer film including an alloy including one or more of the metals, or a multi-layer film including a stack of two or more of the single-layer films.

The pixel separation film 19 defines a light emission region of each pixel, and includes, for example, a photosensitive resin such as polyimide resin, acryl resin, or novolac resin.

The organic layer 20 includes an organic electroluminescence layer (organic EL layer), and emits light in response to application of a drive current. The organic layer 20 includes, for example, a hole injection layer, a hole transport layer, the organic EL layer, and an electron transport layer, all of which are not shown, in this order of closeness to the substrate 10. In the organic EL layer, electrons recombine with holes in response to application of an electric field, resulting in light emission. A material of the organic EL layer may include typical, low-molecular or high-molecular organic materials without any limitation. For example, color light-emitting layers of red, green, and blue may be separately provided by coating for each pixel. Alternatively, a white light emitting layer (for example, stacked color light-emitting layers of red, green, and blue) may be provided over the entire surface of a substrate. The hole injection layer improves hole injection efficiency, and prevents electric leakage. The hole transport layer improves hole transport efficiency to the organic EL layer. These layers other than the organic EL layer may be provided as necessary.

The second electrode 21, which functions as a cathode, for example, is configured of a metal conductive film. In the bottom emission type, the second electrode 21 is configured of a single-layer film including a simple metal including one or more of aluminum, magnesium, calcium, and sodium or a single-layer film including an alloy including one or more of the metals, or a multilayer film as a stack of two or more of the single-layer films. In the top emission type, the second electrode 21 includes a transparent conductive film including ITO or IZO. The second electrode 21 is isolated from the first electrode 18 and provided in common to all pixels on the organic layer 20.

The protective layer 22 may be configured of an insulating material or a conductive material. The insulating material includes, for example, amorphous silicon (a-Si), amorphous silicon carbide (a-SiC), amorphous silicon nitride (a-Si$_{1-x}$N$_x$), and amorphous carbon (a-C).

The substrate 10 and the sealing substrate 23 include, for example, a sheet material including quartz, glass, silicon, and plastic. Inexpensive plastic films may be used for the substrates because a semiconductor layer 11 is deposited without heating the substrate 10 by a sputter process described below. The plastic material includes, for example, polyethylene terephthalate (PET) and polyethylene naphthalate (PEN). Alternatively, a metal substrate including stainless steel (SUS) may be used depending on the purposes. In the top emission type, the sealing substrate 23 is configured of a transparent substrate including glass or plastic, and may have a not-shown color filter or shading film thereon. In the bottom emission type, the substrate 10 is configured of a transparent substrate.

[Transistor 10B]

The transistor 10B corresponds to a sampling transistor Tr1 or a driving transistor Tr2 in a pixel driving circuit 50*a* described below, and is a thin film transistor having a staggered structure, or a so-called top-gate thin film transistor. The transistor 10B has a semiconductor layer 11 on the substrate 10, and has a gate electrode 13A in a selective region on the semiconductor layer 11 with a gate insulating film 12A therebetween. An interlayer insulating film 15 is provided covering the semiconductor layer 11, the gate insulating film 12A, and the gate electrode 13A. The interlayer insulating film 15 has a contact hole H2 configured to oppose the semiconductor layer 11, and a source/drain electrode layer 16 is provided on the interlayer insulating film 15 so as to fill the contact hole H2. Consequently, the source/drain electrode layer 16 is provided in electrical connection with a predetermined region (a source/drain region 11 SD described below) of the semiconductor layer 11.

The gate electrode 13A of the transistor 10B corresponds to a specific example of "second conductive film" in the disclosure, and the gate insulating film 12A corresponds to a specific example of "second insulating film". In the embodiment, the semiconductor layer 11 is provided from the transistor 10B to the holding capacitance element 10C. Specifically, a portion of the semiconductor layer 11 corresponding to the transistor 10B corresponds to "second semiconductor layer", a portion thereof corresponding to the holding capacitance element 10C described below corresponds to "first semiconductor layer". The semiconductor layer 11 corresponds to a specific example of a configuration where the "first semiconductor layer" and the "second semiconductor layer" are integrally provided.

The semiconductor layer 11 forms a channel in response to application of a gate voltage, and includes, for example, an oxide semiconductor including one or more of indium (In), gallium (Ga), zinc (Zn), silicon (Si), and tin (Sn). Such an oxide semiconductor includes, for example, an amorphous oxide semiconductor such as indium-gallium-zinc oxide (IGZO, InGaZnO). A crystalline oxide semiconductor includes zinc oxide (ZnO), indium-zinc oxide (IZO), indium-gallium oxide (IGO), ITO, and indium oxide (InO). The semiconductor layer 11 has the source/drain region 11SD as a region to be connected to the source/drain electrode layer 16 adjacently to a region (channel region 11A) opposed to the gate electrode 13A. Thickness of the semiconductor layer 11 is, for example, about 50 nm.

The source/drain region 11SD, which is provided in a part of the semiconductor layer 11 in a depth direction from a top, is a low-resistance region having a lower electric resistance than the channel region 11A. Such low resistance of the source/drain region 11 SD is achieved by diffusing metal such as aluminum in the oxide semiconductor through a reaction of the metal during a manufacturing process as described below. As a result, the transistor 10B is allowed to have a so-called self-aligned structure and have stable characteristics.

The gate insulating film 12A includes, for example, a single-layer film including one of a silicon oxide (SiO$_x$) film, a silicon nitride (SiN$_x$) film, a silicon oxynitride (SiON) film, and an aluminum oxide (AlO$_x$) film, or a stacked film including two or more of the single-layer films. Among them, the silicon oxide film or the aluminum oxide film is preferable since it hardly deoxidizes the oxide semiconductor. Thickness of the gate insulating film 12A is, for example, about 300 nm. In the embodiment, since the gate insulating film 12A and an insulating film 12B of the holding capacitance element 10C are formed of the same material in the same step, the thickness of the gate insulating film 12A is substantially the same as that of the insulating film 12B. Since the capacitance of the holding capacitance element 10C depends on the thickness of the insulating film 12B, the thickness of the gate insulating film 12A is set in consideration of such thickness dependence of the capacitance.

The gate electrode 13A applies a gate voltage (Vg) to the transistor 10B to control the carrier density in the semiconductor layer 11, and functions as a wiring for supplying an electric potential. The gate electrode 13A includes, for example, a simple metal including one of molybdenum (Mo), titanium (Ti), aluminum, silver, neodymium (Nd), and copper (Cu), or an alloy thereof, or a stacked film including two or more of them. Specifically, the gate electrode 13A includes a stacked structure where a low-resistance metal such as aluminum or silver is sandwiched by molybdenum or titanium, and includes an alloy of aluminum and neodymium (AlNd alloy). Alternatively, the gate electrode 13A may be configured of a transparent conductive film such as ITO. Thickness of the gate electrode 13A is, for example, about 10 nm to 500 nm both inclusive.

The interlayer insulating film 15 has, for example, a thickness of about 2 μm, and includes, for example, a single-layer film including one of a silicon oxide film, a silicon nitride film, a silicon oxynitride film, and an aluminum oxide film, or a stacked film including two or more of them. Alternatively, the interlayer insulating film 15 may include an organic insulating film including acryl or polyimide resin. In particular, use of a stacked film of the silicon oxide film and the aluminum oxide film suppresses infiltration or diffusion of water to the semiconductor layer 11, making it possible to improve electric characteristics and reliability of the transistor 10B.

The source/drain electrode layer 16 functions as a source or drain electrode of the transistor 10B. The source/drain electrode layer 16 has, for example, a thickness of about 200 nm, and includes a similar metal to those listed for the gate electrode 13A or a transparent conductive film. The source/drain electrode layer 16 is preferably configured of a low-resistance metal such as aluminum or copper, and more preferably configured of a stacked film where such a low-resistance metal is sandwiched by barrier layers including titanium or molybdenum. Use of such a stacked film enables a reduction in wiring delay in driving. The source/drain electrode layer 16 is desirably provided in a region other than a portion directly above the gate electrode 12A in order to prevent formation of parasitic capacitance in a crossing region of the gate electrode 12A and the source/drain electrode layer 16.

A planarization film 17 is provided covering the interlayer insulating film 15 and the source/drain electrode layer 16. The planarization film 17 includes, for example, polyimide or acryl-based resin, and is provided over the entire display region. However, the planarization film 17 has a contact hole H3 for electrically connecting the source/drain electrode layer 16 of the transistor 10B to the first electrode 18 of the organic EL element 10A. The first electrode 18 is provided on the planarization film 17 so as to fill the contact hole H3.

[Holding Capacitance Element 10C]

The holding capacitance element 10C holds electric charge corresponding to a video signal in a pixel drive circuit 50a described below, for example. In the embodiment, the holding capacitance element 10C has a stacked structure of the semiconductor layer 11, the insulating film 12B, and a conductive film 13B in order of closeness to the substrate 10. In the holding capacitance element 10C, the semiconductor layer 11 (integrally) extends from the transistor 10B, and the insulating film 12B and the conductive film 13B are provided in a selective region separated from the transistor 10B. Such a stacked structure including the semiconductor layer 11, the insulating film 12B, and the conductive film 13B forms capacitance. Specifically, the holding capacitance element 10C forms the capacitance with use of part of the semiconductor layer 11 for forming the channel in the transistor 10B.

The conductive film 13B of the holding capacitance element 10C corresponds to a specific example of "first conductive film" in the disclosure, and the insulating film 12B corresponds to a specific example of "first insulating film".

The insulating film 12B is formed of the same material as that of the gate insulating film 12A of the transistor 10B, for example, and may be formed together with the gate insulating film 12A in one step. Similarly, the conductive film 13B is formed of the same material as that of the gate electrode 13A, for example, and may be formed together with the gate electrode 13A in one step. In the embodiment, predetermined recesses are provided through the insulating film 12B and the conductive film 13B.

Figure 2:
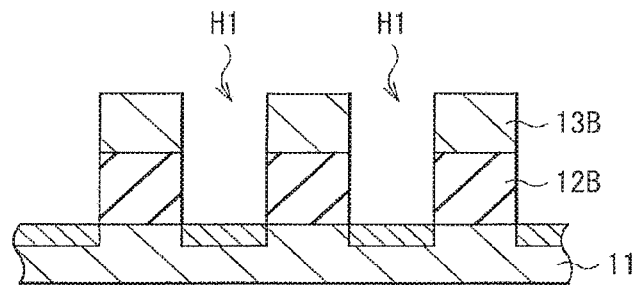
FIG. 2 illustrates a sectional structure of a holding capacitance element shown in FIG. 1 in an enlarged manner.
Figure 3A:
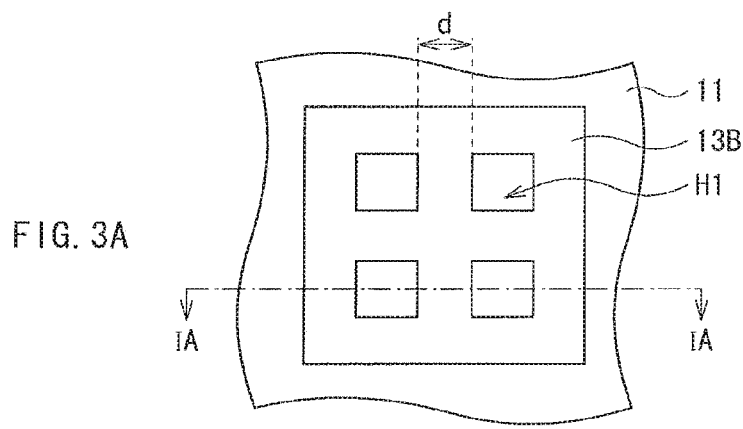
FIGS. 3A and 3B are schematic plan views of the holding capacitance element shown in FIG. 1.
Figure 3B:
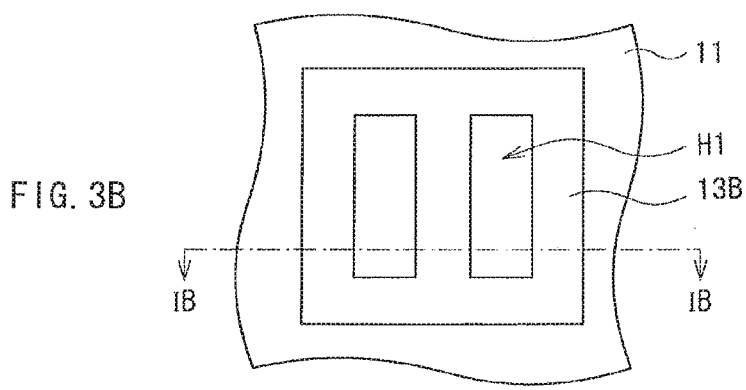

FIG. 2 illustrates a sectional structure of the holding capacitance element 10C in an enlarged manner. As shown in the figure, the holding capacitance element 10C has a recess (an opening) H1, which is formed by removing the conductive film 13B and the insulating film 12B in a thickness direction, in a selective region on the semiconductor layer 11. A surface of the semiconductor layer 11 is exposed from the conductive film 13 and the insulating film 12B in a region corresponding to the recess H1. Only one recess H1 or a plurality of recesses H1 may be provided. In addition, an opening shape of the recess H1 is not limited. FIGS. 3A and 3B illustrate exemplary opening shapes of the recess. FIGS. 3A and 3B are plan views of the holding capacitance element 10C as viewed from a conductive film 13B side. As shown in FIG. 3A, a plurality of (here, four) recesses H1 may be arranged in a lattice pattern as a whole at a predetermined pitch d (a distance between the recesses). Alternatively, as shown in FIG. 3B, a plurality of (here, two) recesses H1 may be arranged in parallel at a predetermined pitch d in a stripe pattern as a whole. It is noted that FIG. 2 corresponds to a sectional arrow view along the IA-IA line of FIG. 3A or the IB-IB line of FIG. 3B.

[High Resistance Film 14]

A high resistance film 14 is provided covering the holding capacitance element 10C, the gate insulating film 12A and the gate electrode 13A of the transistor 10B, and a region on the semiconductor layer 11 unopposed to each of the gate electrode 13A and the holding capacitance element 10C. In detail, the high resistance film 14 is provided covering the inside of the recess H1 in the holding capacitance element 10C. A portion of the high resistance film 14 opposed to the source/drain electrode layer 16 is selectively removed.

The high resistance film 14 is an oxide film changed from a metal film, which functions as a supply source of metal that is diffused into a low-resistance region (for example, the source/drain region 11SD) of the semiconductor layer 11 during a manufacturing process as described below. Such a high resistance film 14 includes, for example, titanium oxide, aluminum oxide, indium oxide, and tin oxide. The high resistance film 14 has a high barrier performance against the external atmosphere, and thus has a function of reducing influence of oxygen and water, which may change the electric characteristics of the semiconductor layer 11 of the transistor 10B, in addition to the above-described function in the manufacturing process. The high resistance film 14 stabilizes the electric characteristics of each of the transistor 10B and the holding capacitance element 10C, making it possible to enhance the effect of the interlayer insulating film 15. Thickness of the high resistance film 14 is, for example, 20 nm or less.

[Configurations of Peripheral Circuits and Pixel Circuit]

Figure 4:
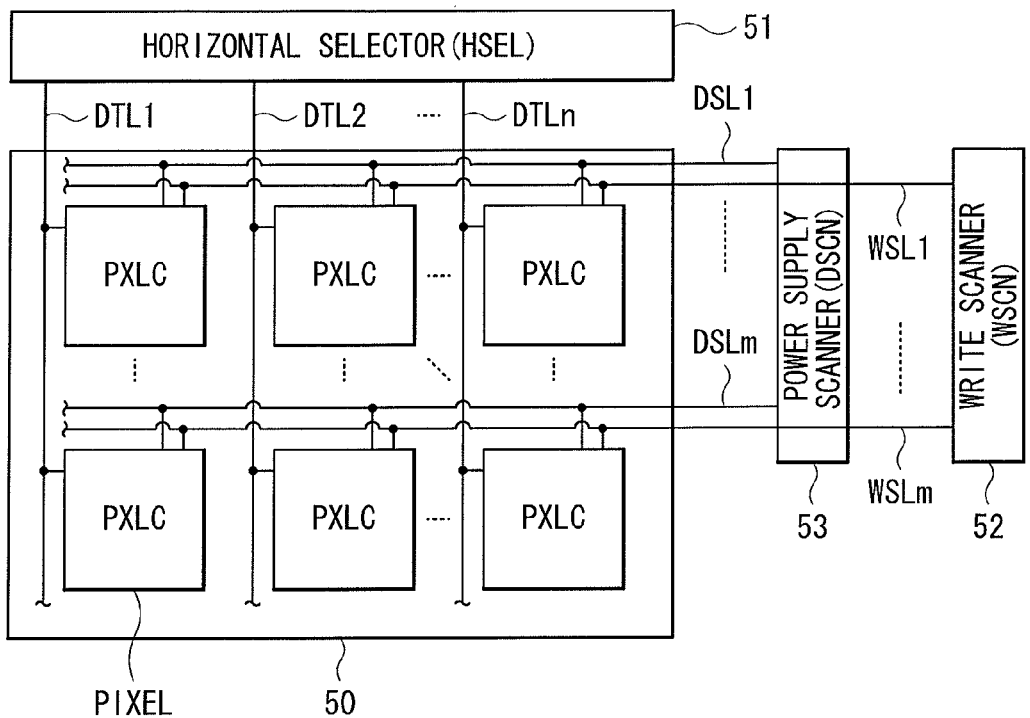
FIG. 4 illustrates an overall configuration of the organic EL display device shown in FIG. 1 and peripheral circuits thereof.

Configurations of peripheral circuits and a pixel circuit of the above-described organic EL display device 1 is now described. FIG. 4 illustrates an overall configuration of the organic EL display device 1 and the peripheral circuits thereof. As shown in the figure, for example, a display region 50, in which a plurality of pixels PXLC including the organic EL elements 10A are arranged in a matrix, is provided on the substrate 10, and a horizontal selector (HSEL) 51 as a signal-line drive circuit, a write scanner (WSCN) 52 as a scan-line drive circuit, and a power supply scanner (DSCN) 53 as a power-supply-line drive circuit are provided in the periphery of the display region 50.

In the display region 50, a plurality of (an integer n) signal lines DTL1 to DTLn are arranged in a column direction, and a plurality of (an integer m) scan lines WSL1 to WSLm and a plurality of (the integer m) power supply lines DSL1 to DSLm are arranged in a row direction. Each pixel PXLC (one of pixels corresponding to R, G, and B) is provided at an intersection of each signal line DTL and each scan line WSL. Each signal line DTL is connected to the horizontal selector 51, which supplies a video signal to each signal line DTL. Each scan line WSL is connected to the write scanner 52, which supplies a scan signal (selection pulse) to each scan line WSL. Each power supply line DSL is connected to the power supply scanner 53, which supplies a power supply signal (control pulse) to each power supply line DSL.

Figure 5:
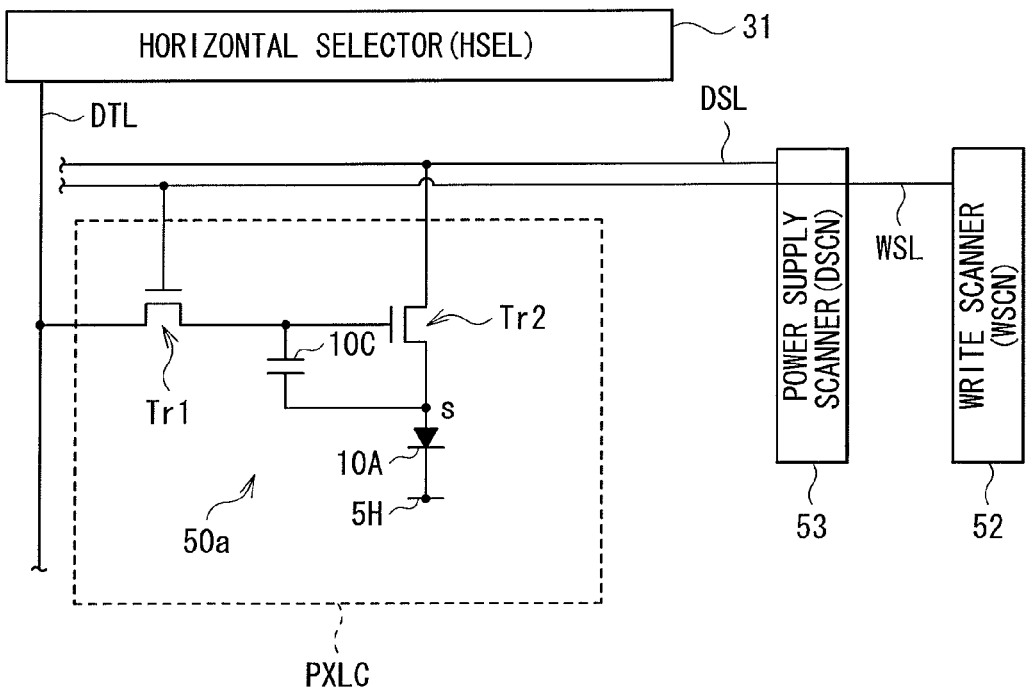
FIG. 5 illustrates a circuit configuration of a pixel shown in FIG. 4.

FIG. 5 specifically illustrates an exemplary circuit configuration of the pixel PXLC. Each pixel PXLC has a pixel circuit 50a including the organic EL element 10A. The pixel circuit 50a is an active drive circuit including the sampling transistor Tr1, a driving transistor Tr2, the holding capacitance element 10C, and the organic EL element 10A. The sampling transistor Tr1 (or the driving transistor Tr2) corresponds to the transistor 10B in the above-described embodiment and the like.

A gate of the sampling transistor Tr1 is connected to a corresponding scan line WSL, one of a source and drain thereof is connected to a corresponding signal line DTL, and the other is connected to a gate of the driving transistor Tr2. A drain of the driving transistor Tr2 is connected to a corresponding power supply line DSL, and a source thereof is connected to an anode of the organic EL element 10A. A cathode of the organic EL element 10A is connected to a ground line 5H. It is noted that the ground line 5H is wired in common to all the pixels PXLC. The holding capacitance element 10C is disposed between the source and gate of the driving transistor Tr2.

The sampling transistor Tr1 becomes conductive in response to a scan signal (selection pulse) supplied from the scan line WSL, and thus samples a signal potential of a video signal supplied from the signal line DTL, and holds the signal potential in the holding capacitance element 10C. The driving transistor Tr2 receives a current from the power supply line DSL set to a predetermined, first potential (not shown), and supplies a drive current to the organic EL element 10A depending on the signal potential held in the holding capacitance element 10C. The organic EL element 10A emits light at a luminance depending on the signal potential of the video signal in response to the drive current supplied from the driving transistor Tr2.

In such a circuit configuration, the sampling transistor Tr1 becomes conductive in response to the scan signal (selection pulse) supplied from the scan line WSL, and thus the signal potential of the video signal supplied from the signal line DTL is sampled and held in the holding capacitance element 10C. The current is supplied from the power supply line DSL set to the first potential to the driving transistor Tr2, and the drive current is supplied to the organic EL element 10A (each organic EL elements of red, green, and blue) depending on the signal potential held in the holding capacitance element 10C. Each organic EL element 10A emits light at the luminance depending on the signal potential of the video signal in response to the supplied drive current. Consequently, the display device displays a video image on the basis of video signals.

[Manufacturing Method]

The above-described organic EL display device 1 is allowed to be manufactured, for example, in the following way. First, the transistor 10B and the holding capacitance element 10C are formed on the substrate 10.

Figure 6A:
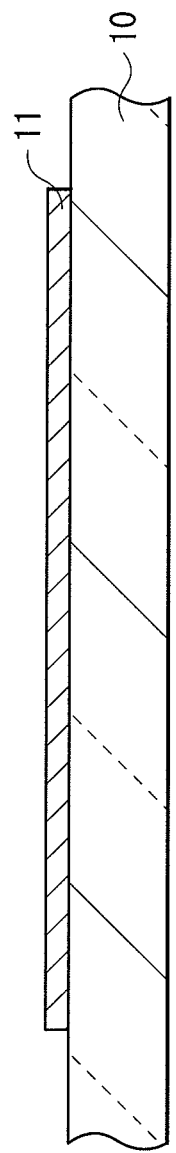
FIGS. 6A and 6B illustrate sequential steps of a manufacturing process of the organic EL display device shown in FIG. 1.

Specifically, first, the semiconductor layer 11 including the above-described oxide semiconductor is deposited by, for example, a sputtering process on the entire surface of the substrate 10, as shown in FIG. 6A. In such deposition, ceramic having the same composition as that of the objective oxide semiconductor is used for a target. Since the carrier concentration in the oxide semiconductor greatly depends on oxygen partial pressure during the sputtering, the oxygen partial pressure is controlled so as to achieve desired transistor characteristics. Then, the deposited semiconductor layer 11 is patterned into a predetermined shape by, for example, photolithography and etching. In the patterning, the semiconductor layer is preferably processed by wet etching using a mixed solution of phosphoric acid, nitric acid, and acetic acid. The mixed solution of phosphoric acid, nitric acid, and acetic acid allows significant increase in etching selectivity of the semiconductor layer to the substrate, so that the semiconductor layer is allowed to be relatively easily processed.

Figure 6B:
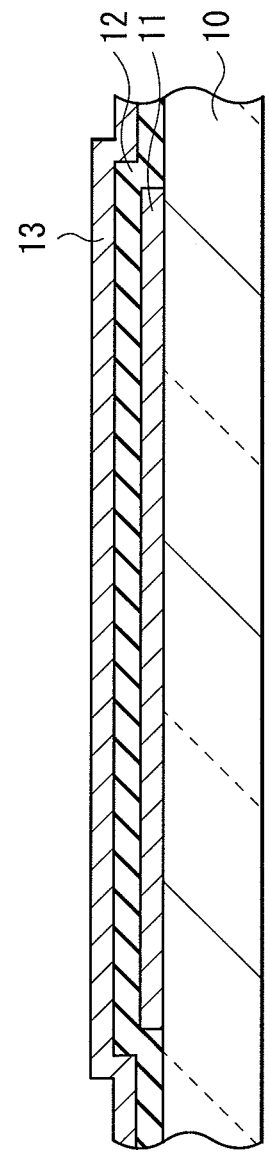

Then, the insulating film 12 (the gate insulating film 12A and the insulating film 12B) including, for example, a silicon oxide film is deposited by, for example, a plasma chemical vapor deposition (CVD) process over the entire surface of the substrate 10, as shown in FIG. 6B. Alternatively, the silicon oxide film may be formed by a reactive sputtering process. An aluminum oxide film may be deposited not only by the reactive sputtering process or the CVD process but also by atomic layer deposition.

Then, the conductive film 13 (the gate electrode 13A and the conductive film 13B) including, for example, a stacked film including molybdenum or titanium and aluminum deposited by, for example, a sputtering process on the entire surface of the insulating film 12, as shown in FIG. 6B.

Figure 7A:
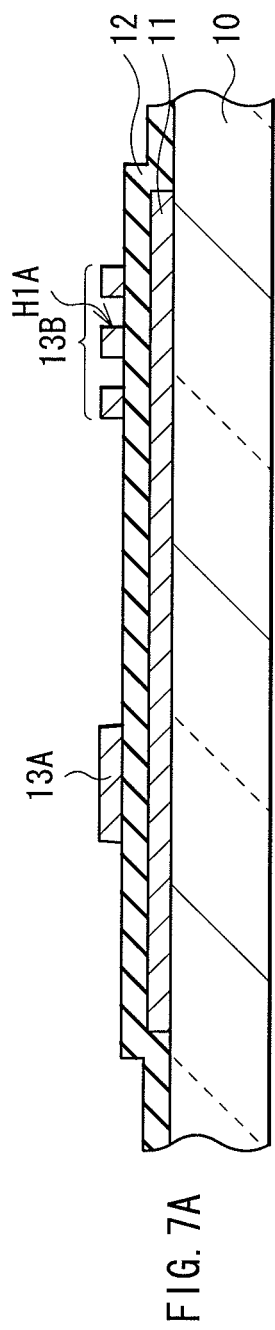
FIGS. 7A and 7B illustrate steps following the steps in FIG. 6B.

Then, the conductive film 13 is patterned by, for example, photolithography and etching so as to form the gate electrode 13A and the conductive film 13B in selective regions on the semiconductor layer 11, as shown in FIG. 7A. Here, an opening H1A (an opening configuring a part of the recess H1) is formed in a selective region of the conductive film 13B.

Figure 7B:
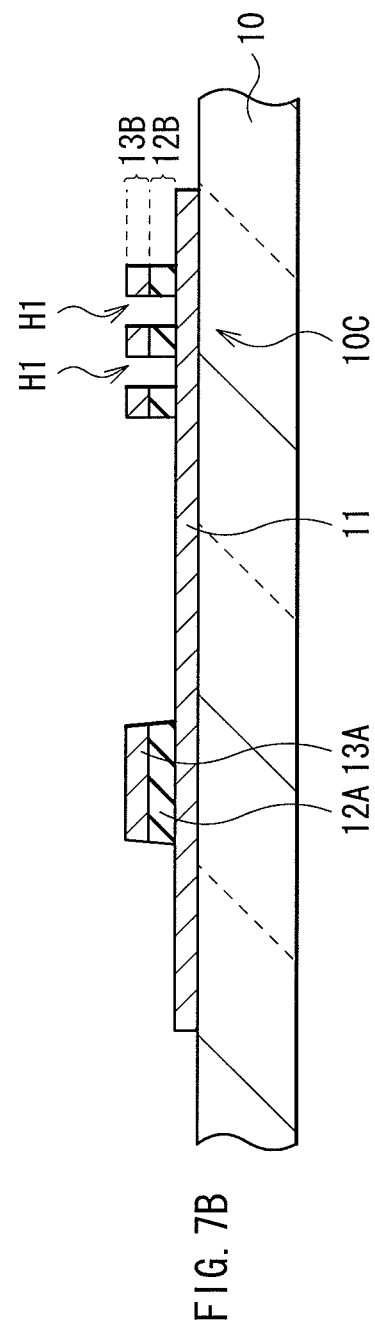

Then, the insulating film 12 is etched with the gate electrode 13A and the conductive film 13 as a mask, as shown in FIG. 7B. In the case where the semiconductor layer 11 is formed of a crystalline material such as ZnO, IZO, and IGO, hydrofluoric acid and the like may be used to maintain a significantly large etching selectivity, so that the semiconductor layer 11 is allowed to be easily processed. Consequently, the gate insulating film 12A is patterned in the same shape as the gate electrode 13A, and the recess H1 is formed through the conductive film 13B and the insulating film 12B. In this way, a stacked structure, where the gate electrode 13A is provided in the selective region on the semiconductor layer 11 with the gate insulating film 12A therebetween, is formed, while the holding capacitance element 10C is formed.

Then, a metal film 14a including a metal, which reacts with oxygen at a relatively low temperature, such as titanium, aluminum, and indium is deposited by, for example, a sputtering process at a thickness of, for example, 5 nm to 10 nm both inclusive over the entire surface of the substrate 10, as shown in FIG. 8A.

Then, the metal film 14a is oxidized through heat treatment at a temperature of, for example, about 300° C., so that the high resistance film 14 including a metal oxide film is formed. Concurrently, the low-resistance region (including the source/drain region 11 SD) is formed in a region unopposed to the gate electrode 12A and the holding capacitance element 10C. Since part of oxygen contained in the oxide semiconductor is used for the oxidation reaction of the metal film 14a, oxygen concentration in the semiconductor layer 11 gradually decreases from its surface in contact with the metal film 14a along with oxidation of the metal film 14a. In addition, metal such as aluminum is diffused into the semiconductor layer 11 from the metal film 14a. The metal element functions as a dopant to reduce resistance of a region of the semiconductor layer 11 in contact with the metal film 14a on a top side of the semiconductor layer 11. This results in formation of the source/drain region 11SD having a low electric resistance.

The metal film 14a is preferably subjected to heat treatment through annealing at a temperature of, for example, about 300° C. Here, the metal film 14a is annealed in an oxidizing gas atmosphere containing oxygen and the like, which suppresses an excessive reduction in oxygen concentration of the low-resistance region, and enables supply of sufficient oxygen to the semiconductor layer 11. This enables omission of a later annealing step, leading to simplification of a process.

Alternatively, the high resistance film 14 may be formed in the following way. For example, the metal film 14a may be deposited while the substrate 10 is maintained at a relatively high temperature of about 200° C. in the step shown in FIG. 8A. This enables a reduction in resistance of the predetermined region of the semiconductor layer 11 without heat treatment shown in FIG. 8B. In such a case, carrier concentration in the semiconductor layer 11 is allowed to be reduced to a level necessary for the transistor.

The metal film 14a is preferably deposited at a thickness of, for example, 10 nm or less. This is because, if the thickness of the metal film 14a is 10 nm or less, the metal film 14a may be completely oxidized (the high resistance film 14 may be formed) through the heat treatment. If the metal film 14a is not completely oxidized, such an unoxidized metal film 14a needs to be removed in an additional etching step. This is because, since the metal film 14a is also deposited on the gate electrode 13A, if the metal film is not sufficiently oxidized, a leakage current may occur. If the metal film 14a is completely oxidized and thus the high resistance film 14 is formed, such a removal step is unnecessary, so that the manufacturing process may be simplified. That is, the leakage current may be prevented without the removal step with etching. It is noted that in the case where the metal film 14a is deposited at the thickness of 10 nm or less, thickness of the high resistance film 14 is about 20 nm or less after the heat treatment.

The method of oxidizing the metal film 14a may include a process of accelerating oxidization of the metal film 14a through oxidization in a steam atmosphere or plasma oxidization, in addition to the above-described heat treatment. In particular, the plasma oxidization has the following advantage. Specifically, the interlayer insulating film 15 is allowed to be successively (continuously) formed by the plasma CVD process after the metal film 14a is subjected to plasma oxidization to form the high resistance film 14. As a result, the steps are simplified. In the plasma oxidization, for example, the metal film 14a is desirably subjected to plasma that is generated in a gas atmosphere containing oxygen such as a mixed gas of oxygen and dinitroxide at a temperature of the substrate 10 of about 200° C. to 400° C. both inclusive. This is because the high resistance film 14 formed through such plasma oxidization may have a high barrier performance against the external atmosphere as described above.

In addition, the method of reducing resistance of the predetermined region of the semiconductor layer 11 may include a method of reducing the resistance through plasma processing, and a method of reducing the resistance through diffusion of hydrogen from a silicon nitride film that is deposited by a plasma CVD process, in addition to the method of reducing the resistance through a reaction of the metal film 14a and the semiconductor layer 11.

Then, the interlayer insulating film 15 is formed as shown in FIG. 9A. Specifically, the interlayer insulating film 15, which includes the above-described organic film including acryl resin, the inorganic film including a silicon oxide film or an aluminum oxide film, or a stacked film of the organic and inorganic films, is deposited at the above-described thickness over the entire surface of the high resistance film 14. The inorganic film such as a silicon oxide film is desirably deposited by a plasma CVD process, and the aluminum oxide film is desirably deposited by a reactive sputtering process using a DC or AC power source with an aluminum target. This is because the inorganic films are allowed to be deposited at high speed by the processes. The organic film is deposited by coating, for example, by spin coating or slit coating.

Then, the contact hole H2 is formed through the interlayer insulating film 15 and the high resistance film 14 by, for example, photolithography and etching in a part of a region opposed to the source/drain region 11 SD of the semiconductor layer 11.

Then, as shown in FIG. 9B, the source/drain electrode layer 16 including the above-described material is deposited by, for example, a sputtering process on the interlayer insulating film 15 so as to fill the contact hole H2, and then the source/drain electrode layer 16 is patterned into a predetermined shape with photolithography and etching. Consequently, the source/drain electrode layer 16 is formed in electrical connection with the source/drain region 11SD of the semiconductor layer 11. As described above, the transistor 10B and the holding capacitance element 10C are formed on the substrate 10.

Then, the planarization film 17 including the above-described material is deposited covering the interlayer insulating film 15 and the source/drain electrode layer 16 by, for example, spin coating or slit coating, and the contact hole H3 is formed in a part of the region opposed to the source/drain electrode layer 16.

Then, the organic EL element 10A is formed on the planarization film 17. Specifically, the first electrode 18 including the above-described material is deposited by, for example, a sputtering process on the planarization film 17 so as to fill the contact hole H3, and then the first electrode 18 is patterned by photolithography and etching. Then, the pixel separation film 19 having the opening is formed on the first electrode 18, and the organic layer 20 is deposited by, for example, a vacuum evaporation process. Then, the second electrode 21 including the above-described material is deposited by, for example, a sputtering process on the organic layer 20. Then, the protective layer 22 is deposited by, for example, a CVD process on the second electrode 21, and then the sealing substrate 23 is attached onto the protective layer 22. This is the end of the manufacturing process of the organic EL display device 1 shown in FIG. 1.

[Operation and Effects]

In the organic EL display device 1 of the embodiment, for example, when a drive current corresponding to a video signal of each color is applied to each pixel corresponding to one of R, G, and B, electrons and holes are injected into the organic layer 20 through the first and second electrodes 18 and 21. The electrons and the holes are recombined in the organic EL layer in the organic layer 20, leading to light emission. In this way, the organic EL display device 1 performs full-color video display of R, G, and B, for example.

In the organic EL display device 1, an electric potential corresponding to a video signal is applied to one end of the holding capacitance element 10C during the video display operation as described above, so that electric charge corresponding to the video signal is accumulated in the holding capacitance element 10C. In the embodiment, the holding capacitance element 10C has a stacked structure where the insulating film 12B is sandwiched between the semiconductor layer 11 including the oxide semiconductor and the conductive film 13B, as described above. Specifically, the holding capacitance element 10C is formed with use of part of the semiconductor layer 11.

Figure 10:
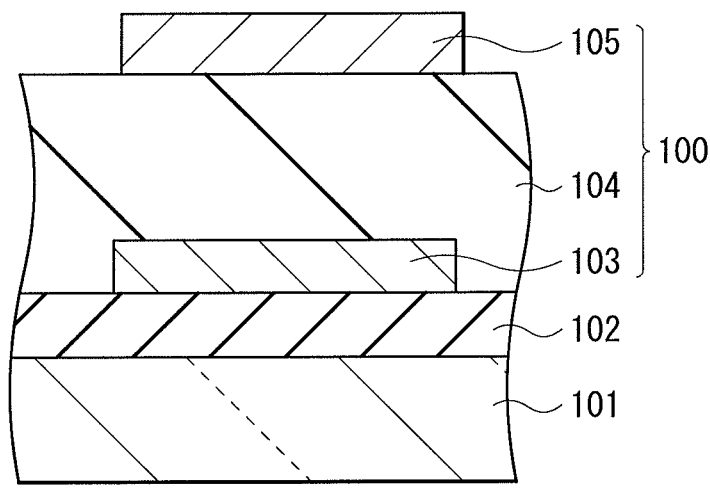
FIG. 10 is a schematic view illustrating a sectional structure of a holding capacitance element according to a comparative example 1.

FIG. 10 illustrates a stacked structure of a holding capacitance element 100 according to a comparative example (comparative example 1) of the embodiment. In the comparative example 1, for example, an insulating film 102 is provided with use of part of a gate insulating film of a transistor on a substrate 101, and a conductive film 103 is provided (in the same layer as a gate electrode of the transistor) on the insulating film 102. An interlayer insulating film 104 having a large thickness is provided on the conductive film 103, and a conductive film 105 is provided in the same layer as a source/drain electrode layer on the interlayer insulating film 104. In this way, the holding capacitance element 100 of the comparative example 1 has a structure where the interlayer insulating film 104 is sandwiched between the conductive films 103 and 105 that are provided in the same layers as the gate electrode and the source/drain electrode of the transistor, respectively. Capacitance is allowed to be also formed through such a stacked structure. In such a holding capacitance element 100, however, thickness of the interlayer insulating film 104 is relatively large (of a scale size in micrometers), and thus capacitance is small, resulting in higher sensitivity to parasitic capacitance.

On the other hand, in the embodiment, the holding capacitance element 10C is provided with use of part of the semiconductor layer 11, and thus the insulating film 12B, which is sandwiched between the semiconductor layer 11 and the conductive film 13B, may be used as a gate insulating film. That is, the thickness of the gate insulating film is the same as that of the gate insulating film 12A (smaller than that of the interlayer insulating film 15). As a result, large capacitance is allowed to be ensured in the embodiment compared with in the comparative example 1.

Figure 11A:
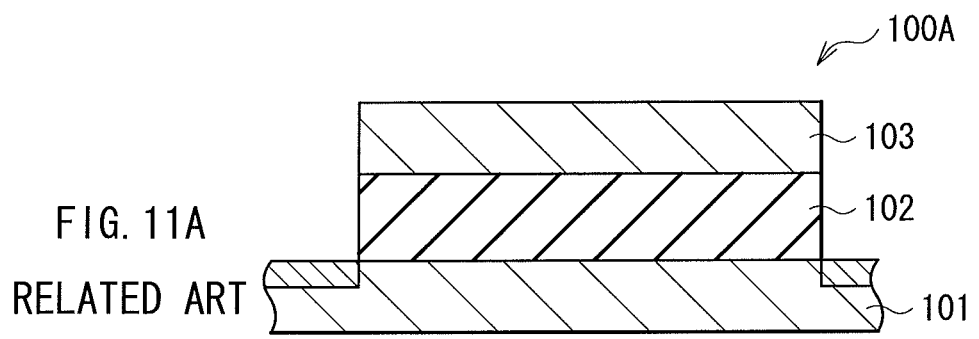
FIGS. 11A and 11B are schematic views illustrating a sectional structure and a planar structure of a holding capacitance element according to a comparative example 2.
Figure 11B:
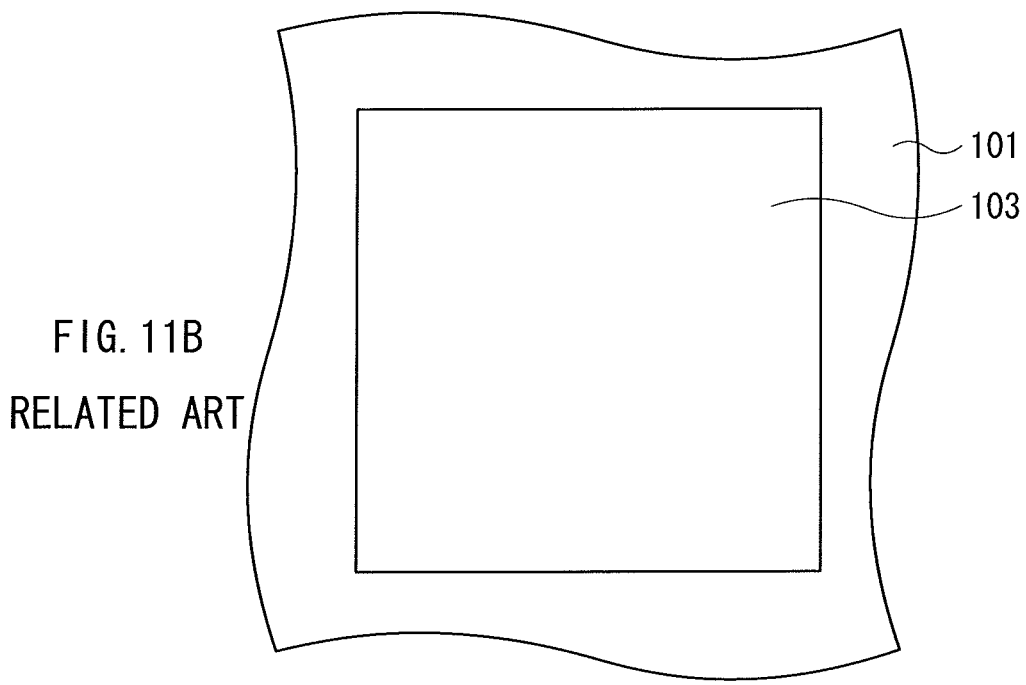

FIG. 11A is a sectional view illustrating a stacked structure of a holding capacitance element 100A according to another comparative example (comparative example 2) of the embodiment. FIG. 11B is a plan view illustrating the stacked structure as viewed from a conductive film 103 side. In the holding capacitance element 100A, a conductive film 103 is provided on a semiconductor layer 101 with an insulating film 102 formed with use of a gate insulating film therebetween. Capacitance is formed through such a stacked structure. In the holding capacitance element 100A, although a relatively large capacitance is allowed to be ensured as in the embodiment, the capacitance may vary due to a voltage applied between the semiconductor layer 101 and the conductive film 103. If the capacitance varies, sufficient capacitance may not be provided depending on drive conditions of a pixel circuit, leading to a reduction in image quality.

Figure 12:
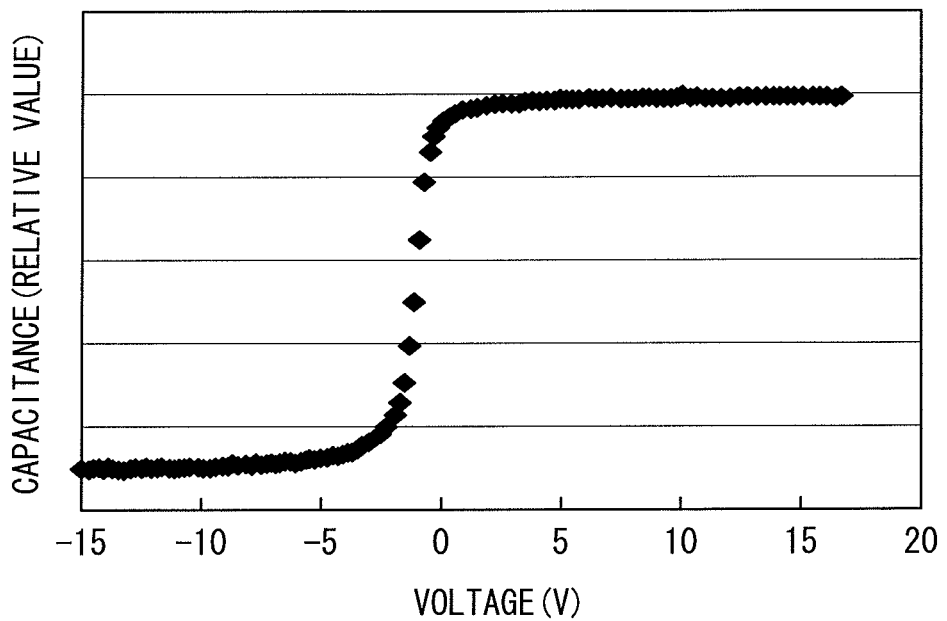
FIG. 12 is a characteristic diagram illustrating a change in capacitance against voltage in the comparative example.
Figure 13:
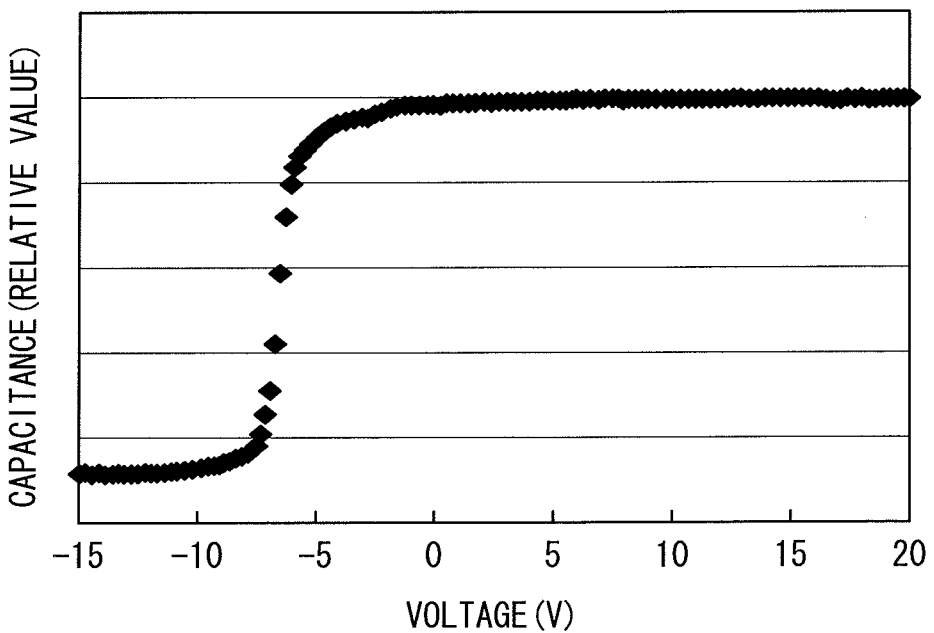
FIG. 13 is a characteristic diagram illustrating a change in capacitance against voltage in the embodiment.

Contrarily, the holding capacitance element 10C of the embodiment has the recess H1, which is formed by removing the conductive film 13B and the insulating film 12B, in the selective region on the semiconductor layer 11. Consequently, since the recess H1 does not have the conductive film 13B or the insulating film 12B on the semiconductor layer 11, oxygen easily separates from the oxide semiconductor through the recess H1. As a result, carrier concentration in the oxide semiconductor film is allowed to be increased. In other words, a threshold voltage in TFT characteristics shifts to a minus side. FIG. 12 illustrates a relationship between the applied voltage and the capacitance in the holding capacitance element according to the comparative example 2. FIG. 13 illustrates a relationship between them in the holding capacitance element 10C of the embodiment. In this way, the voltage characteristics shift to a minus side in the embodiment compared with the comparative example, so that a range, where a variation in capacitance against voltage is small (for example, a region near 0 V), is available. This results in a reduction in voltage dependence of capacitance.

Figure 14:
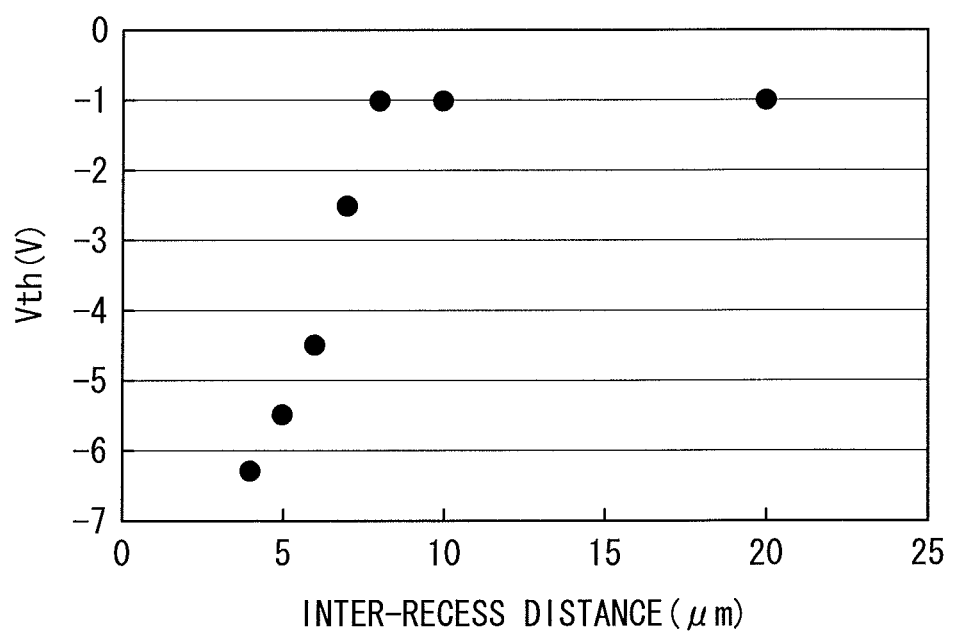
FIG. 14 is a characteristic diagram illustrating a relationship between an inter-recess distance and a threshold voltage.

FIG. 14 illustrates a relationship between an inter-recess distance d (width of a portion including the conductive film 13B and the insulating film 12B) and the threshold voltage (Vth) of the holding capacitance element 10C. As shown in the figure, a smaller inter-recess distance d is desirable for operation of the pixel circuit because it provides a larger capacitance. In particular, in a range of the inter-recess distance d of 8 μm or less, the Vth shifts to a minus side with a decrease in the inter-recess distance d. This reveals that the inter-recess distance d of the holding capacitance element 10C is desirably 8 μm or less.

As described above, in the embodiment, the holding capacitance element 10C, which is provided together with the organic EL element 10A and the transistor 10B on the substrate 10, has a stacked structure where the conductive film 13B (in the same layer as the gate electrode 13A) is provided on the semiconductor layer 11 including the oxide semiconductor with the insulating film 12B (in the same layer as the gate insulating film 12A) therebetween. The recess H1 is provided by removing the conductive film 13B and the insulating film 12B in the selective region on the semiconductor layer 11. This may suppress a variation in capacitance of the holding capacitance element 10C depending on applied voltages, so that a desired capacitance may be maintained. As a result, a reduction in image quality is allowed to be suppressed.

In addition, this allows an active-drive display to display a high-quality image, leading to a large screen, high resolution, and high frame rate. Furthermore, since a relatively large capacitance is achieved, occupancy of wirings may be reduced in a pixel layout, so that a panel having few defects is able to be manufactured at a high yield.

[Modification]

Figure 15:
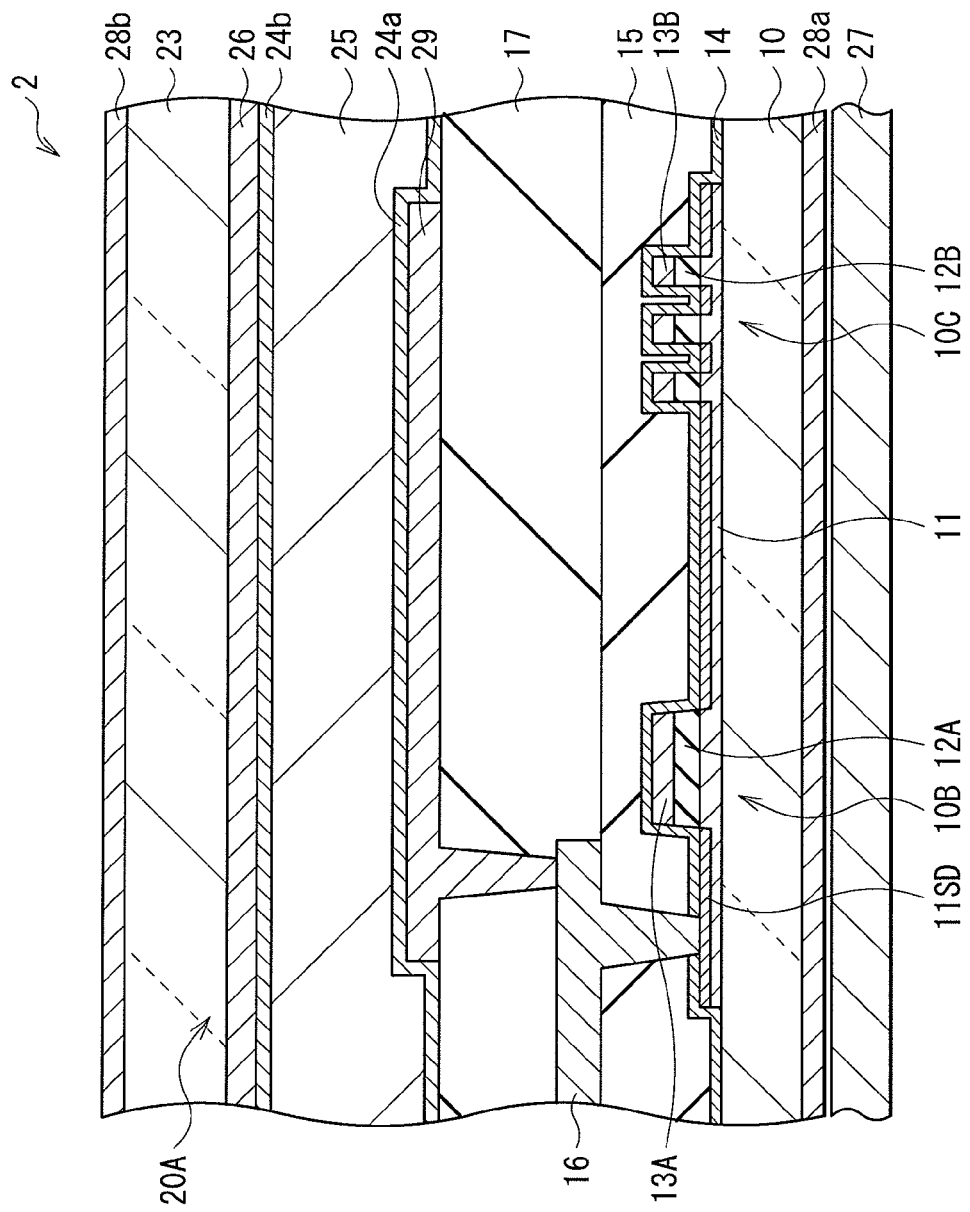
FIG. 15 illustrates a sectional structure of a liquid crystal display device according to a modification.

A display device (liquid crystal display device 2) according to a modification of the embodiment is now described. FIG. 15 illustrates a sectional structure of the liquid crystal display device 2. The liquid crystal display device 2 includes a display element, the transistor 10B, and the holding capacitance element 10C on the substrate 10, as in the organic EL display device of the above-described embodiment, though the display element is a liquid crystal display element 20A instead of the organic EL element. Specifically, in the liquid crystal display device 2, the transistor 10B and the holding capacitance element 10C are provided on the substrate 10, and the liquid crystal display element 20A is provided on these components. A backlight 27 is provided below the substrate 10, and polarizing plates 28a and 28b are attached to the substrate 10 on its backlight 27 side and attached on the sealing substrate 23. The same components as those in the embodiment are designated by the same symbols, and description thereof is appropriately omitted.

In the liquid crystal display element 20A, for example, a liquid crystal layer 25 is enclosed between a pixel electrode 29 and a counter electrode 26, and alignment films 24a and 24b are provided on respective surfaces on a liquid-crystal-layer 25 side of the pixel electrode 29 and the counter electrode 26. The pixel electrode 29 is provided for each pixel, and electrically connected to the source/drain electrode layer 16 of the transistor 10B, for example. The counter electrode 26 is provided in common to a plurality of pixels, and maintained at a common electric potential, for example. The liquid crystal layer 25 includes a liquid crystal that is driven in a vertical alignment (VA) mode, a twisted nematic (TN) mode, or an in-plane switching (IPS) mode, for example.

The backlight 27 is a light source that emits light to the liquid crystal layer 25, and includes, for example, a plurality of light emitting diodes (LEDs) or cold cathode fluorescent lamps (CCFLs). The backlight 27 is controlled to be on or off by a not-shown backlight drive section.

The polarizing plates 28a and 28b (a polarizer and an analyzer) are disposed in a crossed-Nicol manner, for example, so that illumination light from the backlight 27 is blocked during no voltage application ("off" state), and transmitted during voltage application ("on" state).

In such a liquid crystal display device 2, the holding capacitance element 10C is provided with use of part of the semiconductor layer 11 in the transistor 10B, and the recess H1 is provided by removing the conductive film 13B and the insulating film 12B in the selective region on the semiconductor layer 11, as in the organic EL display device 1 of the embodiment. Consequently, the holding capacitance element 10C of the modification also has a relatively large holding capacitance, and achieves a reduction in voltage dependence of capacitance. Specifically, the display device of the disclosure may be applied not only to the above-described organic EL display device 1 but also to the liquid crystal display device 2.

APPLICATION EXAMPLES

Hereinafter, application examples of the above-described display device (the organic EL display device 1 and the liquid crystal display device 2) to electronic apparatuses are described. The electronic apparatuses include, for example, a television apparatus, a digital camera, a notebook personal computer, a mobile terminal device such as a mobile phone, and a video camcorder. In other words, the above-described display device may be applicable to electronic apparatuses in various fields for displaying externally-received or internally-generated video signals as still or video images.

[Module]

Figure 16:
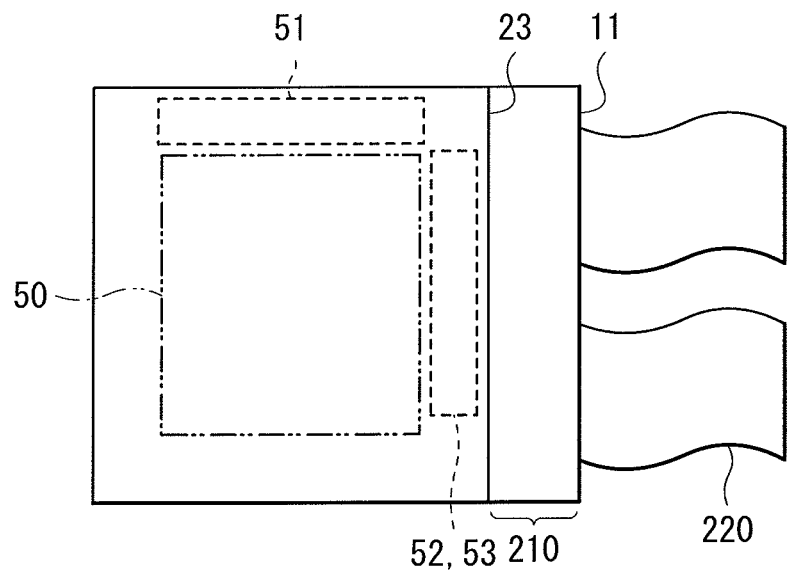
FIG. 16 is a plan view illustrating a schematic configuration of a module with a display device.

The display device is built in various electronic apparatuses such as application examples 1 to 5 described below, for example, as a module shown in FIG. 16. In the module, for example, one side of the substrate 10 has a region 210 exposed from the sealing substrate 23, and an external connection terminal (not shown) is provided on the exposed region 210 by extending wirings for the horizontal selector 51, the write scanner 52, and the power supply scanner 53. The external connection terminal may be attached with a flexible printed circuit (FPC) 220 for input/output of signals.

Application Example 1

Figure 17:
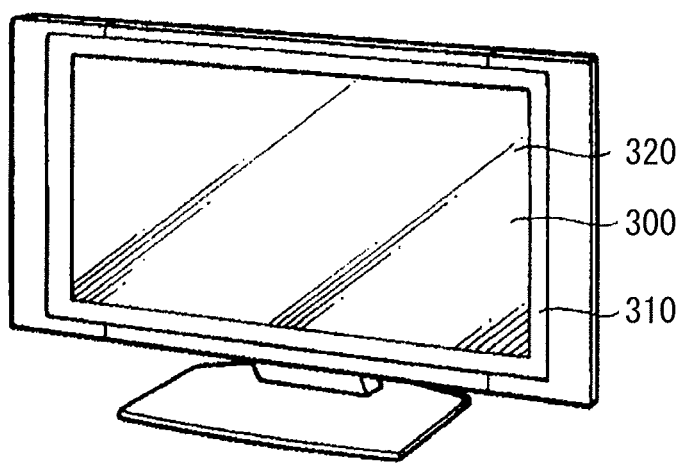
FIG. 17 is a perspective view illustrating appearance of an application example 1.

FIG. 17 illustrates appearance of a television apparatus. The television apparatus has, for example, an image display screen section 300 including a front panel 310 and a filter glass 320, and the image display screen section 300 corresponds to the above-described display device.

Application Example 2

Figure 18A:
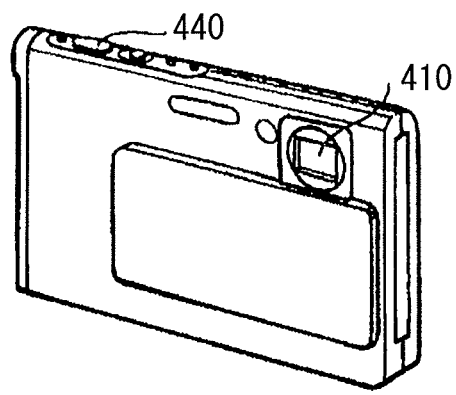
FIG. 18A is a perspective view illustrating appearance of an application example 2 as viewed from its front side.
Figure 18B:
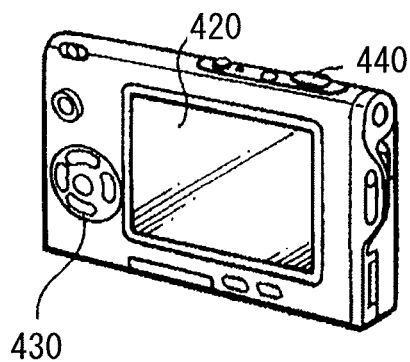
FIG. 18B is a perspective view illustrating appearance thereof as viewed from its back side.

FIGS. 18A and 18B illustrate appearance of a digital camera. The digital camera has, for example, a light emitting section 410 for flash, a display section 420, a menu switch 430, and a shutter button 440, and the display section 420 corresponds to the above-described display device.

Application Example 3

Figure 19:
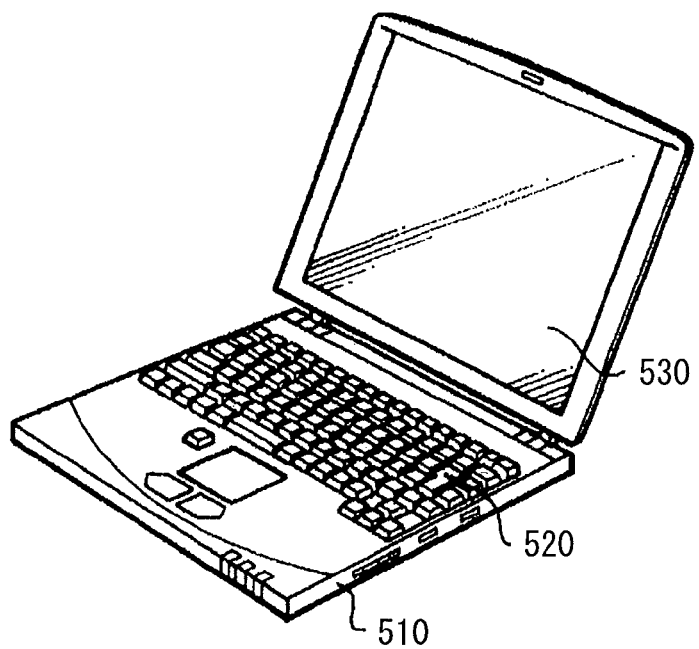
FIG. 19 is a perspective view illustrating appearance of an application example 3.

FIG. 19 illustrates appearance of a notebook personal computer. The notebook personal computer has, for example, a main body 510, a keyboard 520 for input operation of letters and the like, and a display section 530 for displaying images, and the display section 530 corresponds to the above-described display device.

Application Example 4

Figure 20:
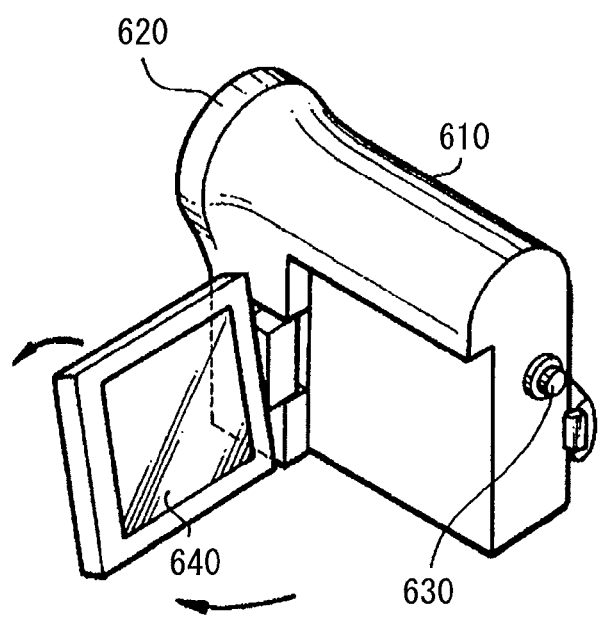
FIG. 20 is a perspective view illustrating appearance of an application example 4.

FIG. 20 illustrates appearance of a video camcorder. The video camcorder has, for example, a main body section 610, an object-shooting lens 620 provided on a front surface of the main body section 610, a start/stop switch 630 for shooting, and a display section 640. The display section 640 corresponds to the above-described display device.

Application Example 5

FIGS. 21A to 21G illustrate appearance of a mobile phone. For example, the mobile phone is configured of an upper housing 710 and a lower housing 720 connected to each other by a hinge section 730, and has a display 740, a sub-display 750, a picture light 760, and a camera 770. The display 740 or the sub-display 750 corresponds to the above-described display device.

While the disclosure has been described with the embodiment and the modification hereinbefore, the disclosure is not limited to the embodiment and the like, and various modifications or alterations may be made. For example, while the embodiment has been exemplified with a configuration where the opening is provided by entirely removing the conductive film 13B and the insulating film 12B in the selective region on the semiconductor layer 11 (the opening is provided through from the surface of the conductive film 13B to the surface of the semiconductor layer 11) as an example of the recess of the disclosure, the conductive film 13B and the insulating film 12B may not be entirely removed. Specifically, the conductive film 13B and the insulating film 12B may be partially removed in a thickness (depth) direction thereof in the selective region on the semiconductor layer 11 (the opening may not be provided through from the surface of the conductive film 13B to the surface of the semiconductor layer 11).

Figure 22A:
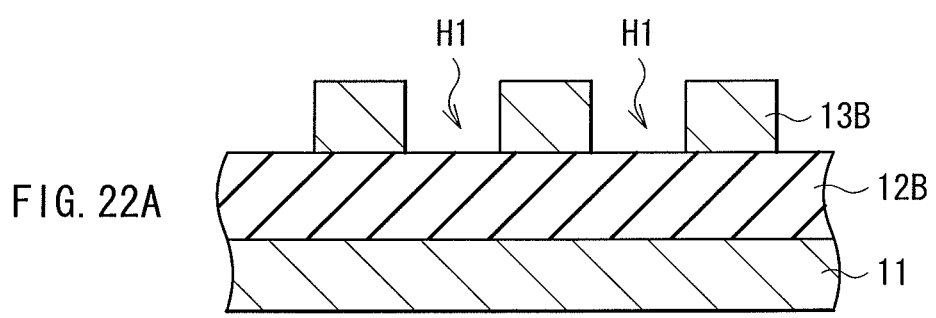
FIGS. 22A and 22B illustrate sectional structures of holding capacitance elements according to other examples.
Figure 22B:
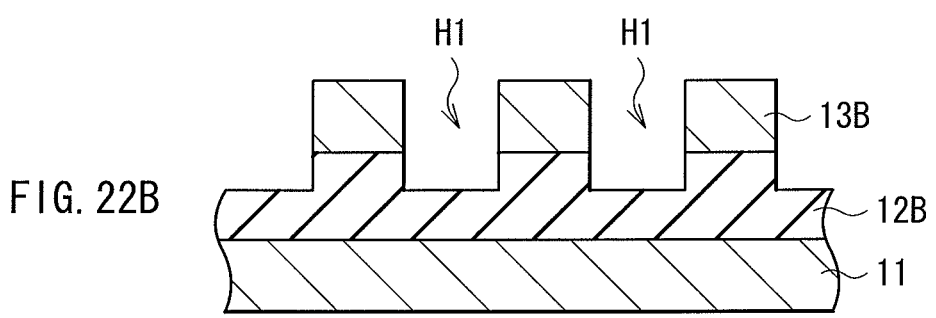

For example, the recess H1 may be provided by selectively removing only the conductive film 13B (or part of the conductive film 13B) in the thickness direction, as shown in FIG. 22A. Alternatively, the recess H1 may be provided by removing all the conductive film 13B and part of the insulating film 12B on its top side, as shown in FIG. 22B. However, the structure, where the recess H1 runs to the surface of the semiconductor layer 11 as in the embodiment, more effectively provides the effect of a reduction in voltage dependence due to separation of oxygen from the semiconductor layer 11, and makes a manufacturing process to be simple.

In addition, while a configuration where the insulating film 12B of the holding capacitance element 10C is patterned separately from the gate insulating film 12A of the transistor 10B is shown in the embodiment and the like, the gate insulating film 12A and the insulating film 12B may not be necessarily separated, and may be continuously formed from the transistor 10B to the holding capacitance element 10C. In addition, while the semiconductor layer 11 is exemplified to be integrally (continuously) formed from the transistor 10B to the holding capacitance element 10C, the semiconductor layer 11 may be separately provided in each of the transistor 10B and the holding capacitance element 10C.

Furthermore, while the embodiment and the like have been described with the exemplary structure having the high resistance film 14, the high resistance film 14 may not be provided. However, the structure having the high resistance film 14 is desirable because it contributes to stably maintain the electric characteristics of the transistor 10B and of the holding capacitance element 10C as described above.

In addition, while resistance of the predetermined region of the semiconductor layer 11 is reduced through a reaction of the metal film 14a and the semiconductor layer 11 in the embodiment and the like, other methods may be used, for example, a method of reducing the resistance through plasma processing, and a method of reducing the resistance through diffusion of hydrogen from a silicon nitride film that is deposited by a plasma CVD process or the like.

In addition, while the recess H1 provided in the holding capacitance element 10C is exemplified to have a shape (an opening shape) of a square shape (FIG. 3A) or a rectangular shape (FIG. 3B) as viewed from a top, the opening shape of the recess is not limited to these, and may include various other shapes (for example, a circular shape and a polygonal shape).

It is possible to achieve at least the following configurations (1) to (9) from the above-described exemplary embodiments and the modifications of the disclosure.

(1) A display device including a substrate, a display element, a transistor as a drive element of the display element, and a holding capacitance element holding electric charge corresponding to a video signal, wherein the display element, the transistor, and the holding capacitance element are provided on the substrate, and the holding capacitance element includes a first semiconductor layer including an oxide semiconductor, a first conductive film provided on the first semiconductor layer, a first insulating film provided between the first semiconductor layer and the first conductive film, and a recess formed by removing part or all of the first conductive film and the first insulating film in a selective region on the first semiconductor layer.

(2) The display device according to (1), wherein the transistor includes, in order of closeness to the substrate, a second semiconductor layer including an oxide semiconductor, a second insulating film as a gate insulating film provided in a selective region on the second semiconductor layer, a second conductive film as a gate electrode provided in a region corresponding to the second insulating film, and a source/drain electrode layer provided in electrical connection with the first semiconductor layer.

(3) The display device according to (2), wherein the first and second semiconductor layers are formed of a same material, the first and second conductive films are formed of a same material, and the first and second insulating films are formed of a same material.

(4) The display device according to (2) or (3), wherein the first semiconductor layer is integrally provided with the second semiconductor layer.

(5) The display device according to any one of (2) to (4), wherein the first and second semiconductor layers have a low-resistance region having a lower electric resistance than other regions in a region unopposed to each of the first conductive film and the holding capacitance element.

(6) The display device according to (5), wherein the source/drain electrode layer is electrically connected to the low-resistance region of the first semiconductor layer.

(7) The display device according to any one of (1) to (6), wherein the holding capacitance element is covered with a high-resistance film.

(8) The display device according to any one of (1) to (7), wherein the display element is an organic electroluminescence element.

(9) The display device according to any one of (1) to (7), wherein the display element is a liquid crystal display element.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A display device comprising:
   a substrate;
   a display element;
   a transistor as a drive element of the display element; and
   a holding capacitance element holding electric charge corresponding to a video signal,
   wherein the display element, the transistor, and the holding capacitance element are provided on the substrate, and
   the holding capacitance element includes:
      a first semiconductor layer including an oxide semiconductor;
      a first conductive film;
      a first insulating film provided between the first semiconductor layer and the first conductive film, and
      a recess formed by removing part or all in thickness of the first conductive film and the first insulating film in a selective region on the first semiconductor layer, wherein the holding capacitance element includes at least three adjacent sectional structures formed from at least two parallel recesses, wherein each of the adjacent sectional structures includes a portion of the first conductive film and a portion of the first insulating film, wherein for each adjacent sectional structure an entire first surface of the portion of the first insulating film is in contact with the portion of the first conductive film, an entire second surface opposite the first surface is in contact with the first semiconductor layer, and third and fourth surfaces between the first and second surfaces are in contact with an oxide film, and wherein the portion of the first conductive film and the portion of the first insulating film of each of the adjacent sectional structures are separated from the portion of the first conductive film and the portion of the first insulating film of an adjacent sectional structure by at least the oxide film.

2. The display device according to claim 1,
wherein the transistor includes, in order of closeness to the substrate,
a second semiconductor layer including an oxide semiconductor,
a second insulating film as a gate insulating film provided in a selective region on the second semiconductor layer,
a second conductive film as a gate electrode provided in a region corresponding to the second insulating film, and
a source/drain electrode layer provided in electrical connection with the first semiconductor layer.

3. The display device according to claim 2,
wherein the first and second semiconductor layers are formed of a same material,
the first and second conductive films are formed of a same material, and
the first and second insulating films are formed of a same material.

4. The display device according to claim 3, wherein the first semiconductor layer is integrally provided with the second semiconductor layer.

5. The display device according to claim 4, wherein the first and second semiconductor layers have a low-resistance region having a lower electric resistance than a region unopposed to each of the first conductive film and the holding capacitance element.

6. The display device according to claim 5, wherein the source/drain electrode layer is electrically connected to the low-resistance region of the second semiconductor layer.

7. The display device according to claim 1, wherein the first display element is an organic electroluminescence element.

8. The display device according to claim 1, wherein the first display element is a liquid crystal display element.

9. An electronic apparatus comprising:
   a display device including:
   a substrate, and including, on the substrate,
   a display element;
   a transistor as a drive element of the display element; and
   a holding capacitance element holding electric charge corresponding to a video signal,
   wherein the holding capacitance element includes:
      a first semiconductor layer including an oxide semiconductor;
      a first conductive film;

a first insulating film provided between the first semiconductor layer and the first conductive film, wherein a first surface of the first insulating film is in contact with a first surface of the first conductive film; and at least a first recess formed by removing part or all in thickness of the first conductive film and the first insulating film in a selective region on the first semiconductor layer, wherein the holding capacitance element includes at least three adjacent sectional structures formed from at least two parallel recesses, wherein for each adjacent sectional structure the first surface of the first insulating film is entirely in contact with the first surface of the first conductive film, an entire second surface of the first insulating film opposite the first surface is in contact with the first semiconductor layer, and third and fourth surfaces of the first insulating film between the first and second surfaces are in contact with an oxide film, and wherein a width of at least the first surface of the first conductive film of the holding capacitance element is equal to a width of the first surface of the first insulating film of the holding capacitance element.

10. The electronic apparatus of claim 9, wherein the transistor includes, in order of closeness to the substrate, a second semiconductor layer including an oxide semiconductor, a second insulating film as a gate insulating film provided in a selective region on the second semiconductor layer, a second conductive film as a gate electrode provided in a region corresponding to the second insulating film, and a source/drain electrode layer provided in electrical connection with the first semiconductor layer.

11. The electronic apparatus of claim 10, wherein the first and second semiconductor layers are formed of a same material, the first and second conductive films are formed of a same material, and the first and second insulating films are formed of a same material.

12. The electronic apparatus of claim 1, wherein the first semiconductor layer is integrally provided with the second semiconductor layer.

13. The electronic apparatus of claim 12, wherein the first and second semiconductor layers have a low-resistance region having a lower electric resistance than a region unopposed to each of the first conductive film and the holding capacitance element.

14. The electronic apparatus of claim 13, wherein the source/drain electrode layer is electrically connected to the low-resistance region of the second semiconductor layer.

15. The electronic apparatus of claim 9, wherein the display element is an organic electroluminescence element.

16. The electronic apparatus of claim 9, wherein the display element is a liquid crystal display element.

* * * * *